US012660458B2

(12) United States Patent (10) Patent No.: US 12,660,458 B2
Ushikubo et al. (45) Date of Patent: Jun. 16, 2026

(54) DISPLAY DEVICE

(71) Applicant: Magnolia White Corporation, Tokyo (JP)

(72) Inventors: Takahiro Ushikubo, Tokyo (JP); Hayata Aoki, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 435 days.

(21) Appl. No.: 18/314,823

(22) Filed: May 10, 2023

(65) Prior Publication Data

US 2023/0371335 A1    Nov. 16, 2023

(30) Foreign Application Priority Data

May 13, 2022    (JP) ................................. 2022-079521

(51) Int. Cl.
*H10K 59/35*        (2023.01)
*H10K 59/80*        (2023.01)
(52) U.S. Cl.
CPC ....... *H10K 59/352* (2023.02); *H10K 59/8792* (2023.02)

(58) Field of Classification Search
CPC ...... H10K 59/35; H10K 50/865; H10K 59/38; G02F 1/133514
See application file for complete search history.

(56) References Cited

U.S. PATENT DOCUMENTS

| | | | | |
|---|---|---|---|---|
| 2019/0103573 A1* | 4/2019 | Hamada | ............... | H10K 50/171 |
| 2022/0238608 A1* | 7/2022 | Moon | ........................ | G03F 1/50 |
| 2022/0246684 A1* | 8/2022 | Kim | ....................... | H10K 59/38 |

FOREIGN PATENT DOCUMENTS

| | | |
|---|---|---|
| EP | 2485567 A1 | 8/2012 |
| WO | 2011/058596 A1 | 5/2011 |

* cited by examiner

*Primary Examiner* — Alia Sabur
(74) *Attorney, Agent, or Firm* — XSENSUS LLP

(57) ABSTRACT
According to one embodiment, a display device includes a first emitting layer provided in each of first pixels, a second emitting layer provided in each of second pixels, a third emitting layer provided in each of third pixels and a color filter provided to oppose the third emitting layer, and a threshold of the third emitting layer is higher than a threshold of the first emitting layer and a threshold of the second emitting layer, and the color filter overlaps a boundary between each first emitting layer and a respective third emitting layer and a boundary between a second emitting layer and a respective third emitting layer.

14 Claims, 11 Drawing Sheets

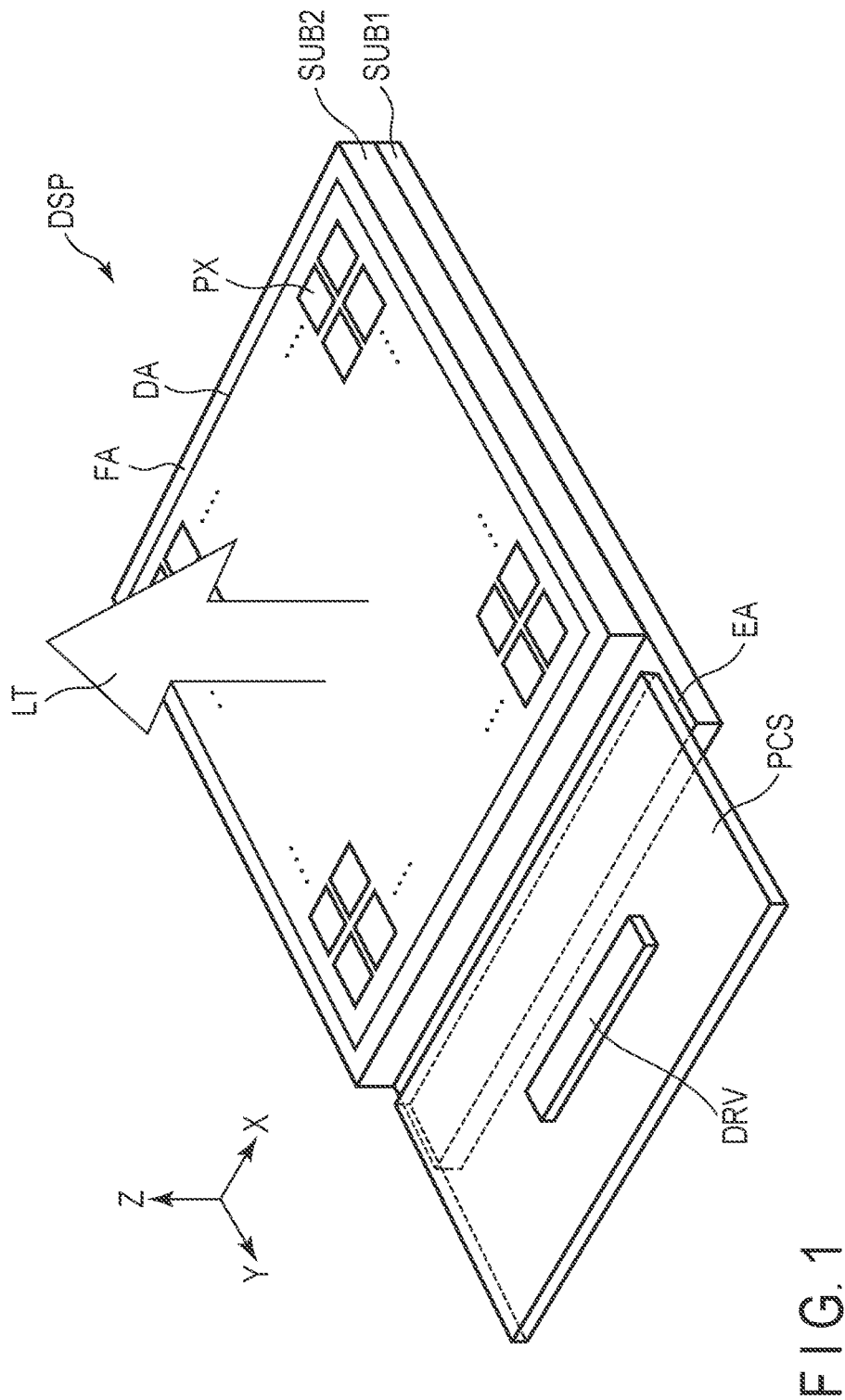
F I G. 1

DSPr
BM
DA
PXB    PXR    PXB    PXR    PXB    PXR    A1
       PXG           PXG           PXG
PXB    PXR    PXB    PXR    PXB    PXR
       PXG    A2     PXG           PXG
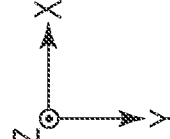
F I G. 2

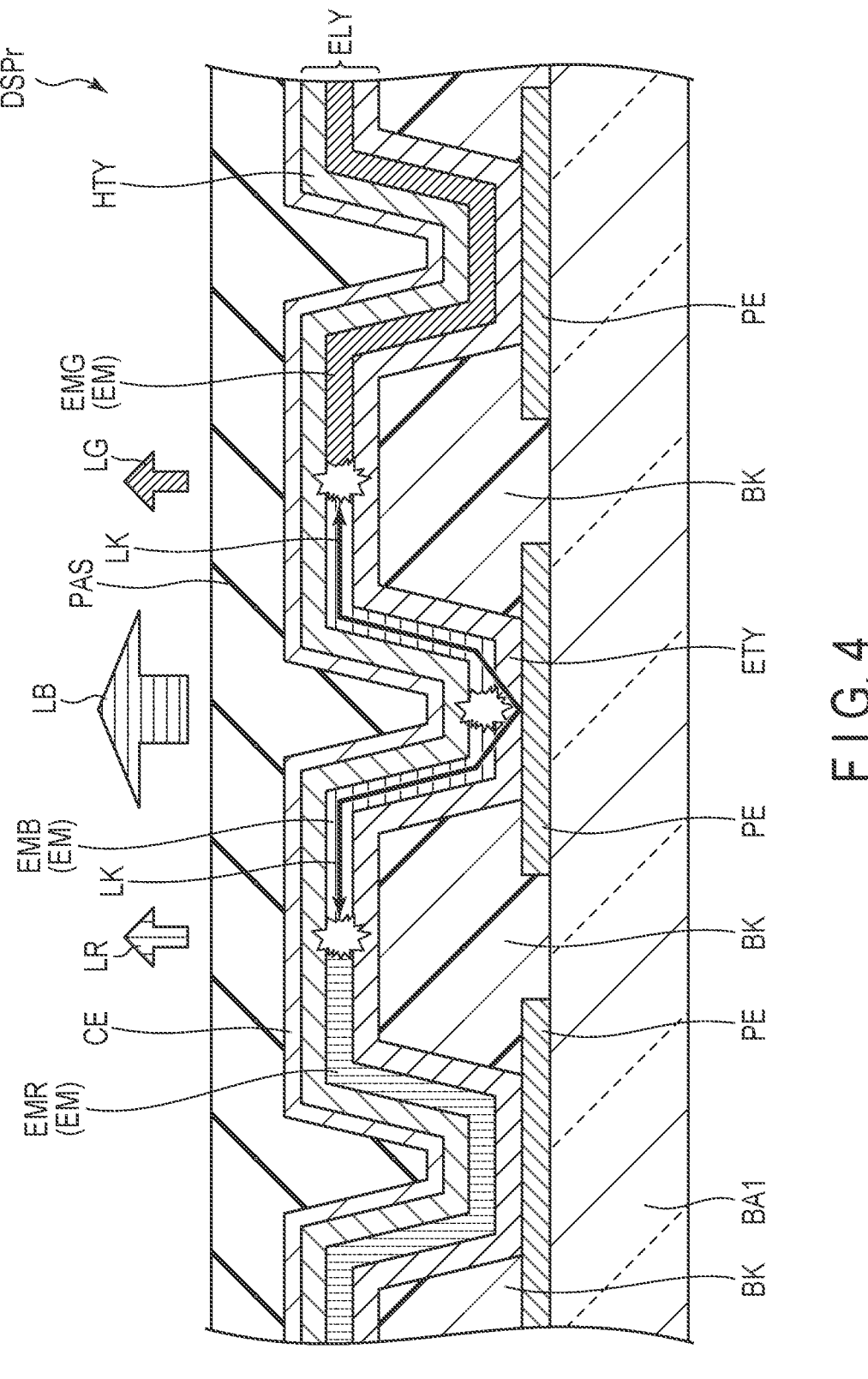
F I G. 4

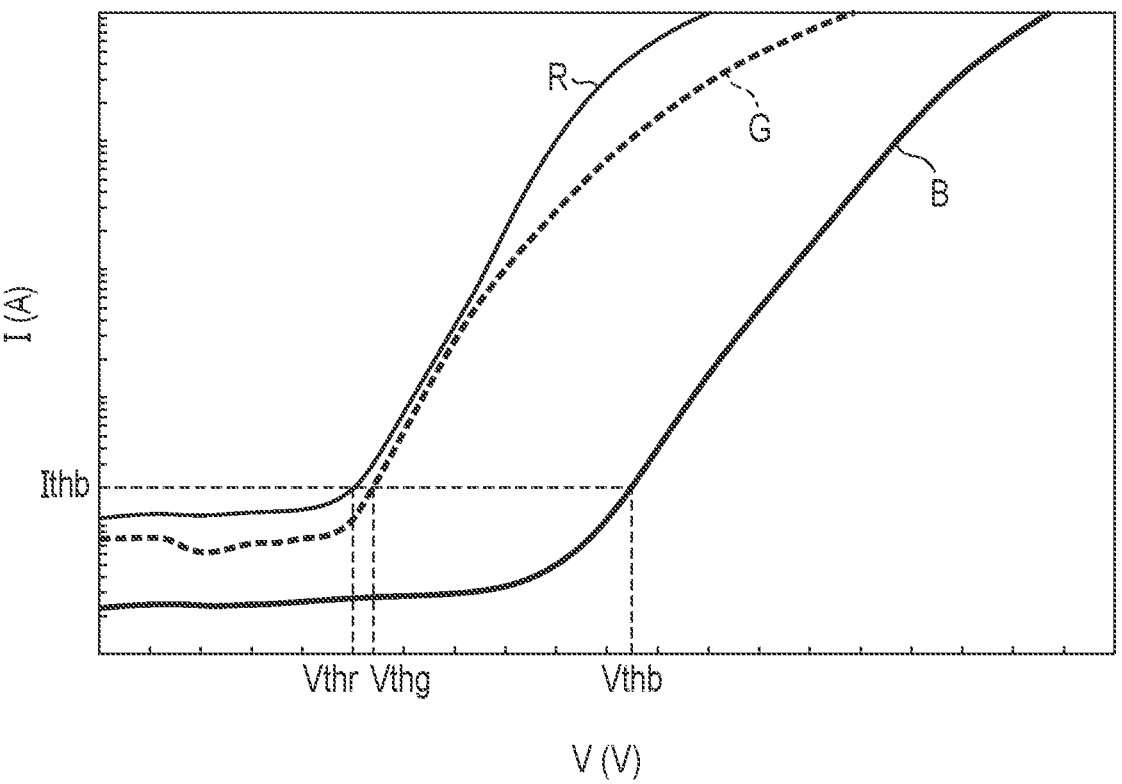
F I G. 5

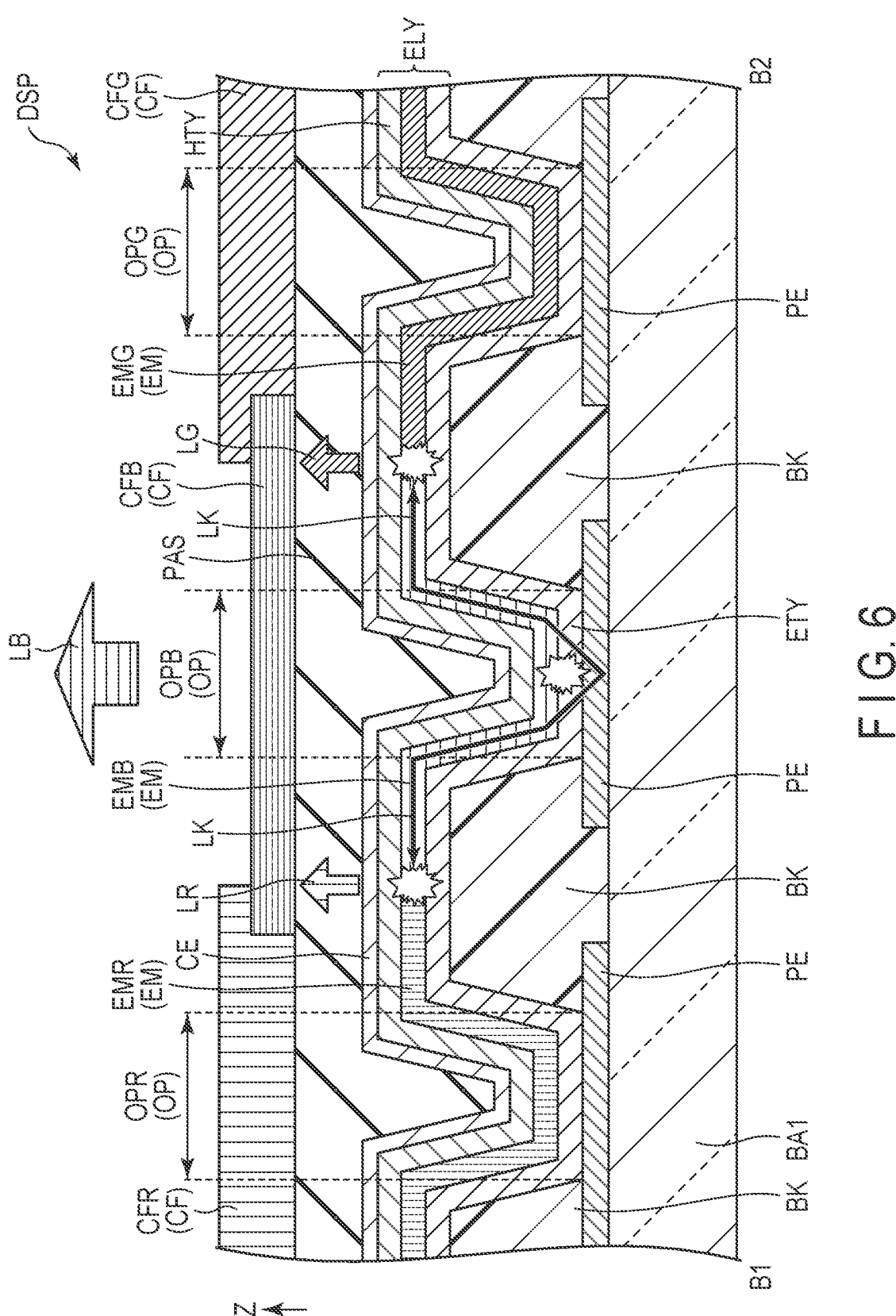
F I G. 6

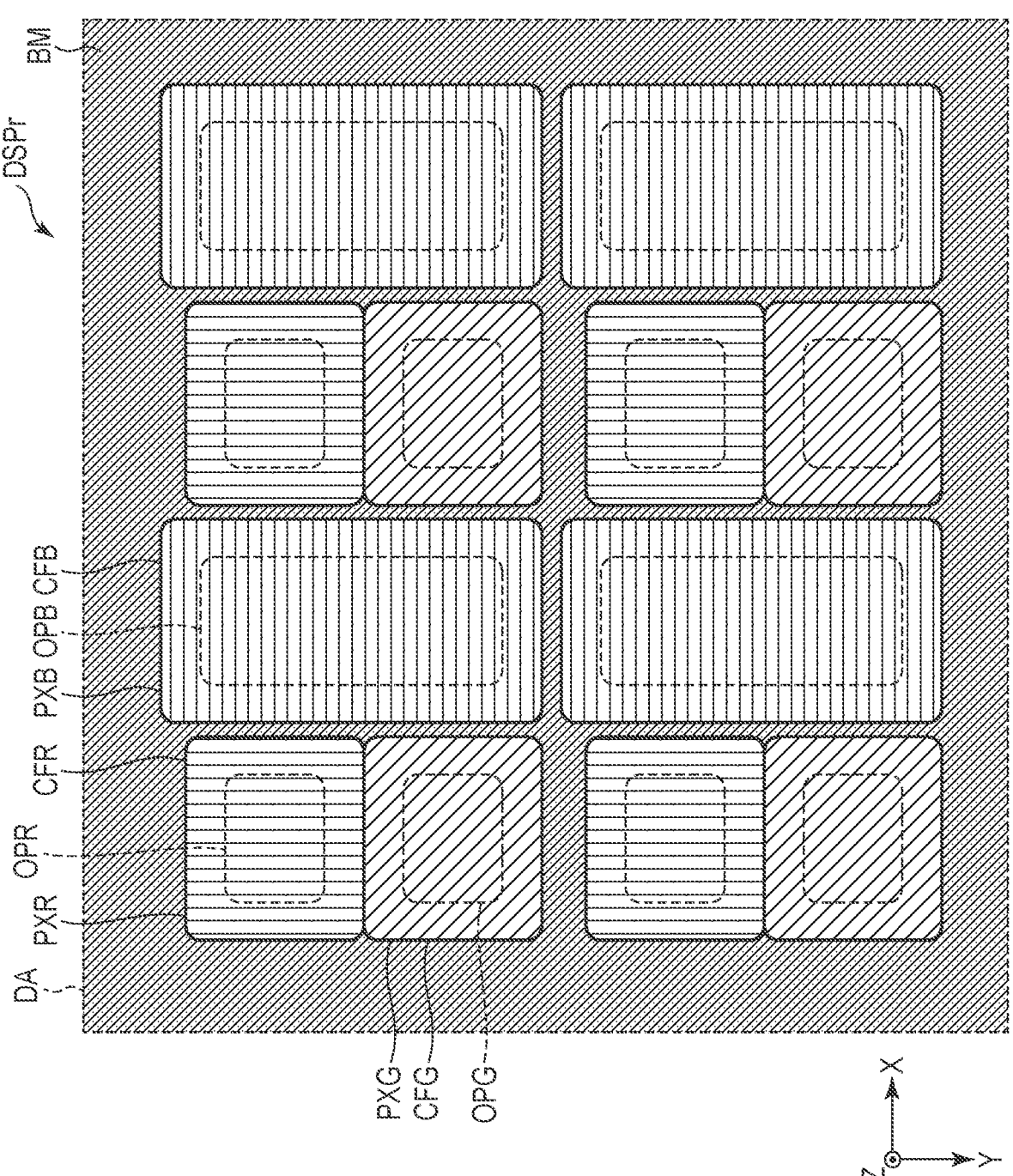
F I G. 7

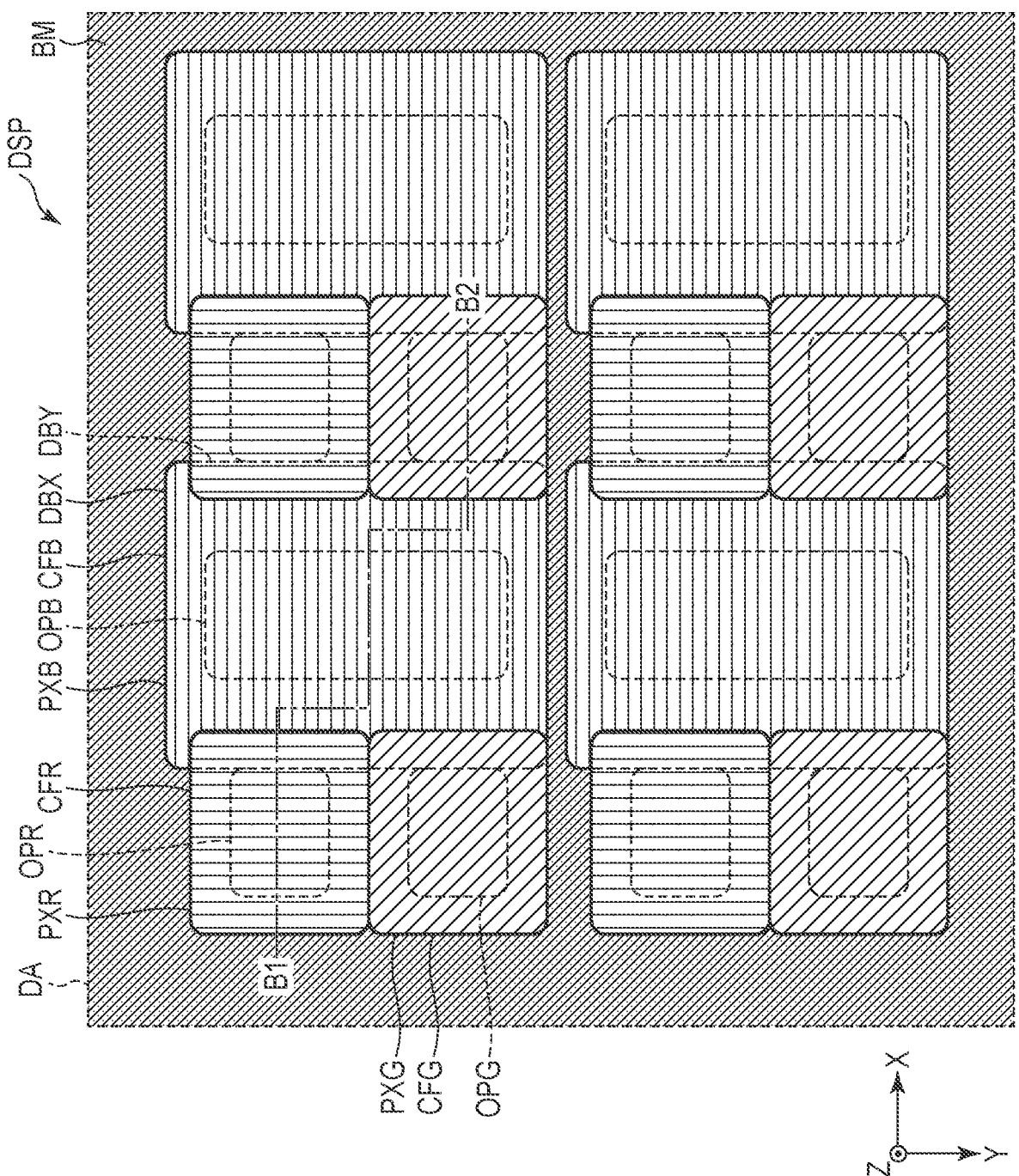
F I G . 8

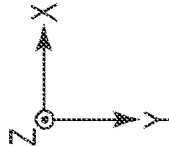
F I G. 10

DISPLAY DEVICE

CROSS-REFERENCE TO RELATED APPLICATIONS

This application is based upon and claims the benefit of priority from Japanese Patent Application No. 2022-079521, filed May 13, 2022, the entire contents of which are incorporated herein by reference.

FIELD

Embodiments described herein relate generally to a display device.

BACKGROUND

In recent years, display devices using organic electroluminescent (EL) emitting materials have been developed. These display devices include an organic EL layer containing a emitting material. In the organic layer of the organic EL element, the emissive material is excited by the recombination of electrons and holes, and emission occurs when the emissive material returns to its ground state.

BRIEF DESCRIPTION OF THE DRAWINGS

FIG. 1 is an overall perspective view showing a display device of an embodiment.

FIG. 2 is a partial plan view schematically showing a configuration example of a display device of a comparative example.

FIG. 4 is an enlarged cross-sectional view of a part of FIG. 3.

FIG. 5 is a diagram showing the relationship between voltage and current applied to a red (R) emitting layer, a green (G) emitting layer and a blue (B) emitting layer.

FIG. 6 is a cross-sectional view schematically showing a configuration example of the display device of the embodiment.

FIG. 7 is a plan view schematically showing a configuration example of a display device of a comparative example.

FIG. 8 is a plan view schematically showing a configuration example of the embodiment.

FIG. 10 is a plan view schematically showing a configuration example of the display device of the embodiment.

DETAILED DESCRIPTION

Figure 3:
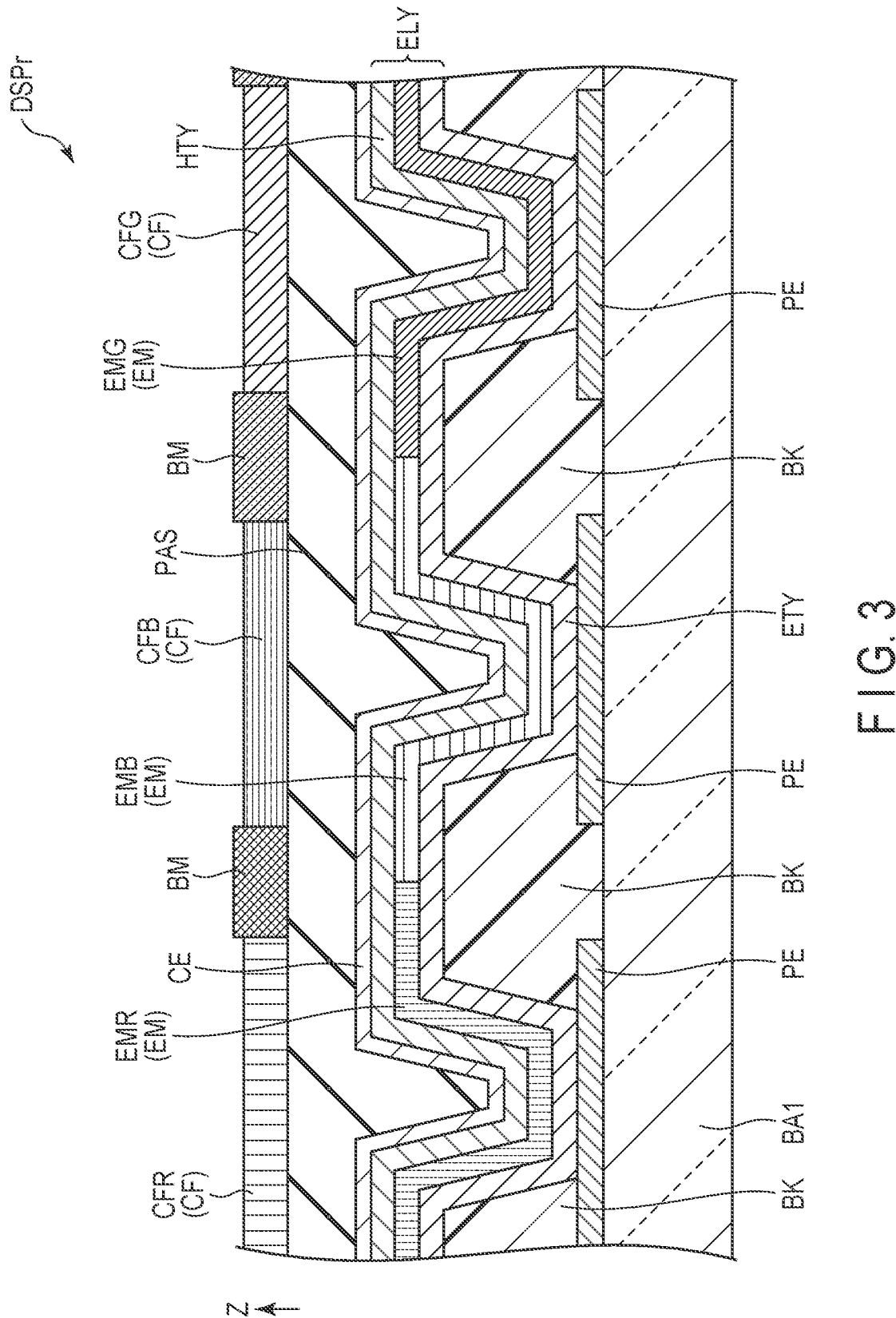
FIG. 3 is a cross-sectional view schematically showing a configuration of the display device shown in FIG. 2, taken along line A1-A2.

In general, according to one embodiment, a display device comprising: a plurality of first pixels, a plurality of second pixels and a plurality of third pixels; a first emitting layer provided in each of the plurality of first pixels, which emits a first color; a second emitting layer provided in each of the plurality of second pixels, which emits a second color; a third emitting layer provided in each of the third plurality of third pixels, which emits a third color; and a color filter provided to oppose the third emitting layer, wherein a threshold of the third emitting layer is higher than a threshold of the first emitting layer and a threshold of the second emitting layer, and the color filter overlaps a boundary between each first emitting layer and a respective third emitting layer and a boundary between a second emitting layer and a respective third emitting layer.

According to another embodiment, a display device comprising: a plurality of first pixels, a plurality of second pixels and a plurality of third pixels; a first emitting layer provided in each of the plurality of first pixels, which emits a red color; a second emitting layer provided in each of the plurality of second pixels, which emits a green color; a third emitting layer provided in each of the third plurality of third pixels, which emits a blue color; and a color filter provided to oppose the third emitting layer, wherein the blue color filter overlaps a boundary between each first emitting layer and a respective third emitting layer and a boundary between a second emitting layer and a respective third emitting layer.

According to an embodiment, a display device with high display quality is provided.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

The embodiments described herein are not general ones, but rather embodiments that illustrate the same or corresponding special technical features of the invention. The following is a detailed description of one embodiment of a display device with reference to the drawings.

In this embodiment, a first direction X, a second direction Y and a third direction Z are orthogonal to each other, but may intersect at an angle other than 90°. The direction toward the tip of the arrow in the third direction Z is defined as up or above, and the direction opposite to the direction toward the tip of the arrow in the third direction Z is defined as down or below. The first direction X, the second direction Y, and the third direction Z may as well be referred to as an X direction, a Y direction and a Z direction, respectively.

With such expressions as "the second member above the first member" and "the second member below the first member", the second member may be in contact with the first member or may be located away from the first member. In the latter case, a third member may be interposed between the first member and the second member. On the other hand, with such expressions as "the second member on the first member" and "the second member beneath the first member", the second member is in contact with the first member.

Further, it is assumed that there is an observation position to observe the display device on a tip side of the arrow in the third direction Z. Here, viewing from this observation position toward the X-Y plane defined by the first direction X and the second direction Y is referred to as plan view. Viewing a cross-section of the display device in the X-Z plane defined by the first direction X and the third direction Z or in the Y-Z plane defined by the second direction Y and the third direction Z is referred to as cross-sectional view.

[Embodiment]

FIG. 1 is an overall view of a display device of an embodiment. A display device DSP comprises a display area DA and a peripheral area FA provided around the display area DA on a substrate SUB1. The display device DSP includes a plurality of pixels PX arranged in the display area DA. In the display device DSP, light LT is transmitted from a rear surface to a front surface and vice versa.

On an upper surface of the display area DA, a substrate SUB2 is provided as a sealing member. The substrate SUB2 is fixed to the substrate SUB1 by a sealant (not shown) applied to surround the display area DA. The display area DA formed on the substrate SUB1 is sealed so as not to be exposed to the atmosphere by the substrate SUB2 as a sealing member and the sealant.

An area EA of an end portion of the substrate SUB1 is located on an outer side of the substrate SUB2. In the area EA, a wiring substrate PCS is provided. The wiring substrate PCS is provided with a drive element DRV that outputs video signals and drive signals. The signals from the drive element DRV are input to the pixels PX in the display area DA via the wiring substrate PCS. Based on the video signals and various types of control signals, the pixels PX emits light.

FIG. 2 is a partial plan view schematically showing a configuration example of a display device in a comparative example. The pixels PX of the display device DSPr include pixels PXR emitting red color, pixels PXG emitting green color and pixels PXB emitting blue color. The pixels PXR, pixels PXG and pixels PXB may as well be referred to as the first pixels, second pixels and third pixels, respectively. Further, the red (R), green (G) and blue (B) may as well be referred to as the first color, second color and third color, respectively.

The pixels PXR are each disposed adjacent along the first direction X to the respective one of the pixels PXB. The pixels PXR are each located adjacent along the second direction Y to the respective one of the pixels PXG.

The pixels PXG are each disposed adjacent along the first direction X to the respective one of the pixels PXB. The Pixels PXG are each adjacent along the second direction Y to the respective one of the pixels PXR.

The pixels PXB are each disposed adjacent along the first direction X to the respective ones of the pixels PXR and pixels PXG. The pixels PXB are each disposed adjacent to another pixel PXB along the second direction Y.

The length of the pixels PXR along the first direction X is approximately equal to the length of the pixels PXG along the first direction X. The length of the pixels PXR along the second direction Y is approximately equal to the length of the pixels PXG along the second direction Y. In other words, the size of the pixels PXR and the size of the pixels PXG are approximately equal to each other.

The length of the pixels PXB along the first direction X is approximately equal to the length of the pixels PXR along the first direction X as well as to the length of the pixels PXG along the first direction X. The length of the pixels PXB along the second direction Y is approximately twice each of the length of the pixel PXR along the second direction Y and the length of the pixels PXG along the second direction Y. In other words, the size of the pixels PXB is approximately twice each of the size of the pixels PXR and that of the pixels PXG.

The pixel array shown in FIG. 2 is referred to, in this specification, as a square-stripe array, or S-stripe array for short.

Between the regions where the pixels PXR, pixels PXG and pixels PXB are provided respectively, respective light-shielding layers BM are provided.

Note here that the configuration of the embodiment is not limited to the pixel arrangement shown in FIG. 2, and can be applied to display devices having different pixel arrangements as will be described later.

FIG. 3 is a cross-sectional view schematically showing a configuration of the display device taken along line A1-A2 shown in FIG. 2.

The base BAL is made of, for example, glass or a resin material. Usable examples thereof are acrylic, polyimide, polyethylene terephthalate, polyethylene naphthalate and the like, and the base may be formed from a single layer or a stacked structure of multiple layers of any of these.

On the substrate BA1, a pixel electrode PE is provided. The pixel electrode PE is formed, for example, in a three-layer stacked structure of indium zinc oxide (IZO), silver (Ag) and IZO.

Note here that a transistor connected to the pixel electrode PE is provided between the base BAL and the pixel electrode PE. The transistor applies voltage to the pixel electrode PE according to the signals input from the signal lines and scanning lines connected thereto.

A bank BK (which may as well be referred to as a projecting portion or a rib) is provided between each adjacent pair of pixel electrodes PE. As the material for the bank BK, an organic material such as photosensitive acrylic, polyimide or the like is used. The bank BK contains apertures each opened to expose a part of the respective pixel electrode PE. Further, an end portion of each aperture OP should preferably be gently tapered in cross-sectional view. When the end portion of the aperture OP has a steep shape, coverage error is likely to occur in the organic EL layer ELY, which is to be formed later.

The organic EL layer ELY is located between each adjacent pair portions of the bank BK so as to overlap the respective pixel electrode PE. The organic EL layer ELY includes a hole transport layer HTY, an emitting layer EM and an electron transport layer ETY.

The emitting layer EM contains an organic EL emitting material. The emitting layer EM is formed using different materials so that various colors of light are emitted depending on the pixels PXR, pixels PXG and pixels PXB. The emitting layer located in the pixels PXR is referred to as EMR, the emitting layer for the pixels PXG is referred to as EMG, and the emitting layer for the pixels PXB is referred to as EMB.

The hole transport layer HTY and the electron transport layer ETY are provided over the entire pixels PX regardless of whether they are the pixels PXR, pixels PXG or pixels PXB. Note here that the hole transport layer HTY and the electron transport layer ETY may as well be formed by applying coating for each pixel separately, instead of applying over all the pixels PX. The hole transport layer HTY and the electron transport layer ETY each may be formed as a single layer or multiple layers. The hole transport layer HTY moves positive holes from the pixel electrode PE (anode) to the emitting layer EM. The electron transport layer ETY moves electrons from the common electrode CE (cathode) to the emitting layer EM.

The common electrode CE is provided on the organic EL layer ELY. As the common electrode CE, a magnesium-silver alloy (MgAg) film is formed as such a thin film that the light emitted from the organic EL layer ELY can be transmitted therethrough. The common electrode CE is provided over all the pixels PX.

In this embodiment, the pixel electrode PE serves as an anode and the common electrode CE serves as a cathode. The emission light generated in the organic EL layer ELY is extracted upward via the common electrode CE. In other words, the display device DSP has a top emission structure.

An insulating layer PAS is provided to cover the common electrode CE. The insulating layer PAS has a function of preventing moisture from entering the organic EL layer ELY from the outside. As the insulating layer PAS, a type that has high gas barrier property is preferable. An example of the insulating layer PAS is an insulating layer prepared by sandwiching an organic insulating layer between two inorganic insulating layers containing nitrogen. Examples of the material for the organic insulating layer include acrylic resin, epoxy resin, polyimide resin and the like. Examples of the material for the inorganic insulating layer containing nitrogen include silicon nitride and aluminum nitride.

On the insulating layer PAS, color filters CF and light-shielding layers BM are provided. The color filters CF are colored in different colors according to the pixels PXR, pixels PXG and pixels PXB, respectively. The color filters provided for the pixels PXR are referred to as color filters CFR, those provided for the pixels PXG are referred to as color filters CFG, and those provided for the pixels PXB are referred to as color filters CFB. The color filters CFR, color filters CFG and color filters CFB are provided to opposite the emitting layers EMR, emitting layers EMG and emitting layers EMB, respectively.

The color filters CFR, color filters CFG and color filters CFB may as well be referred to as red color filters, green color filters and blue color filters, respectively. Or, the color filters CFR, color filters CFG and color filters CFB may as well be referred to as first color filters, second color filters and third color filters, respectively. A light-shielding layer BM is provided between each respective adjacent pair of a color filter CFR and a color filter CFG, that of a color filter CFG and a color filter CFB and that of a color filter CFB and a color filter CFR.

In display devices that employ an organic EL layer, a polarizer (a polarizing plate) is often used to suppress reflection of external light. Although the polarizer is effective in suppressing the reflection of external light, it may undesirably absorb the light emitted pixels PX. For example, the polarizer reduces the luminance of the emitted light to 50% or less.

However, by using color filters in place of the polarizers, it is possible to increase the amount of light extracted to the outside. This is because the amount of light absorbed by the color filters is less than that of the polarizers. In this manner, it is possible to obtain a display device that can suppress the reflection of external light and exhibits high luminance.

However, in the display device of the comparative example, current leakage may occur to adjacent pixels, which may undesirably cause an unintended color to be emitted. When light emission of an unintended color occurs, it raises a problem that the display quality of the display device is degraded. The unintended color emission is caused by a difference in the resistance of the emitting layer EM and by a difference in threshold voltage. For example, there may occur such a phenomenon that when a pixel PX containing a high-threshold emitting layer EM is made to emit light, a pixel PX with a low-threshold emitting layer EM as well emit light.

FIG. 4 is an enlarged cross-sectional view of a part of FIG. 3. FIG. 5 is a diagram illustrating the relationship between the voltage and current applied to each of the red (R) emitting layer, green (G) emitting layer and blue (B) emitting layer.

As shown in FIG. 5, in the blue (B) emitting layer EMB, when a voltage Vthb is applied, a current Ithb flows, thus causing light emission. The voltage Vthb is referred to as a threshold voltage of the emitting layer EMB. A voltage Vthr, which is the applied voltage when the red (R) emitting layer EMR emits light, and a voltage Vthg, which is the applied voltage when the green (G) emitting layer EMG emits light, are lower than the voltage Vthb. That is, even when voltages lower than the voltage Vthb are applied to the emitting layer EMR and the emitting layer EMG, the emitting layer EMR and the emitting layer EMG emit light. Note that the voltages Vthr and Vthg are the threshold voltages of the emitting layer EMR and the emitting layer EMG, respectively.

In the pixel PXR, pixel PXG and pixel PXB, the common electrode CE is located over these pixels. With this configuration, even if voltage is applied only to the pixel PXB, that is, voltage is applied to the pixel electrode PE and the common electrode CE of the pixel PXB, the electric field EF generated between the electrodes applies not only between the pixel electrode PE of the pixel PXB and the region of the common electrode CE opposing it, but also spreads toward neighboring pixels PX.

When the electric field EF spreads, holes may flow through the hole transport layer HTL when the emitting layer EMB emits light, which may cause a leakage current LK in some cases. When holes reach the emitting layer EMR of a neighboring pixel PXR or the emitting layer EMG of the pixel PXG, the emitting layer EMR or the emitting layer EMG, which has a low threshold voltage, emits light unintentionally. As a result, not only blue light LB from the pixel PXB, but also red light LR from the pixel PXR and green light LG from the pixel PXG may be undesirably emitted.

In this embodiment, the size of the color filter CFB is made larger than the other color filters CFR and CFG in the pixel PXB containing a high-threshold emitting layer EMB. The color filter CFB covers the boundary between the emitting layer EMB and the emitting layer EMR, as well as the boundary between the emitting layer EMB and the emitting layer EMG, in plan view. With this configuration, even if light emission unintentionally occurs in the emitting layer EMR and the emitting layer EMG, such emitted light can be cut off by the color filters CFB.

FIG. 6 is a cross-sectional view schematically showing a configuration example of the display device of the embodiment. The display device DSP shown in FIG. 6 is different from the display device DSPr shown in FIG. 3 in that the color filter CFB covers the boundary between the emitting layer EMB and the emitting layer EMR, and the boundary between the emitting layer EMB and the emitting layer EMG in plan view.

Of the regions where the pixel electrode PE, the emitting layer EM and the common electrode CE overlap, those not overlapping the banks BK are referred to as apertures OP. The apertures in the pixel PXR, pixel PXG and pixel PXB are referred to as an opening OPR, opening OPG and opening OBB, respectively.

An end portion of the color filter CFR and an end portion of the color filter CFG each may overlap the color filter CFB.

When the color filter CFB covers the boundary between the emitting layer EMB and the emitting layer EMR and the boundary between the emitting layer EMB and the emitting layer EMG, the following effect can be expected. That is, in the case where a pixel PXB is made to emit light, even if unintended light emission occurs in an emitting layer EMR near the boundary between the emitting layer EMB and the emitting layer EMR, and in the emitting layer EMG near the boundary between the emitting layer EMB and the emitting layer EMG, such light emission can be shielded by the overlapping color filter CFB.

The boundary between the emitting layer EMB and the emitting layer EMR and the boundary between the emitting layer EMB and the emitting layer EMG are located on the banks BK, respectively. That is, the above-described unintended light emission occurs on the banks BK. Here, the boundaries are covered by the color filters CFB, no light emission occurs on the banks BK.

FIG. 7 is a plan view schematically showing a configuration example of a display device in a comparative example. In the display device DSPr, a pixel PXR includes an aperture OPR and a color filter CFR, a pixel PXG includes an aperture OPG and a color filter CFG, and a pixel PXB includes an aperture OPB and a color filter CFB.

In the display device DSPr shown in FIG. 7, the boundary between the emitting layers EMB and EMR, and the boundary between the emitting layers EMB and EMG are not covered by the color filters CFB. Therefore, the light emission generated in these boundaries is not shielded by the color filters CFB.

FIG. 8 is a plan view schematically showing a configuration example of an embodiment. In a display device DSP shown in FIG. 8, the configurations of pixels PXR and PXG are similar to those of FIG. 7. A cross-sectional view of the display device illustrated in FIG. 8, taken along line B1-B2 is shown in FIG. 6.

On the other hand, in a pixel PXB, an end portion DBY of the color filter CFB overlaps a color filter CFR and a color filter CFB. The end portion DBY is the end portion of the color filter CFB, which extends along the second direction Y.

In FIG. 8, the end portion DBX of the color filter CFB along the first direction X does not overlap other color filters. But, such a configuration is not limited to that of this embodiment. The end portion DBX may as well overlap other color filters.

The length of the color filter CFB along the first direction X is greater than the length of each of the color filter CFR and the color filter CFG along the first direction X. In other words, the size of the color filter CFB in the X-Y plane is greater than the size of each of the color filter CFR and the color filter CFG.

With the configuration shown in FIGS. 6 and 8, if voltage is applied to a high-threshold emitting layer EMB and the low-threshold emitting layer EMR and emitting layer EMG unintentionally emit light, it is possible to shield such unintended emission by the color filters CFB. The color filters CFB cover the boundary between the emitting layer EMR and the emitting layer EMB and the boundary between the emitting layer EMG and the emitting layer EMB. Thus, the color filters CFB shield the unintended light emission, thereby making it possible to prevent mixing of colors. Thus, a display device with high display quality can be obtained.

In the display device DSP of this embodiment, the color filters CFR and the color filters CFG may not necessarily be provided. This is because the color filters CFB thus provided can shield the light from the emitting layers EMR and EMG, which can cause the mixing of colors.

Figure 9:
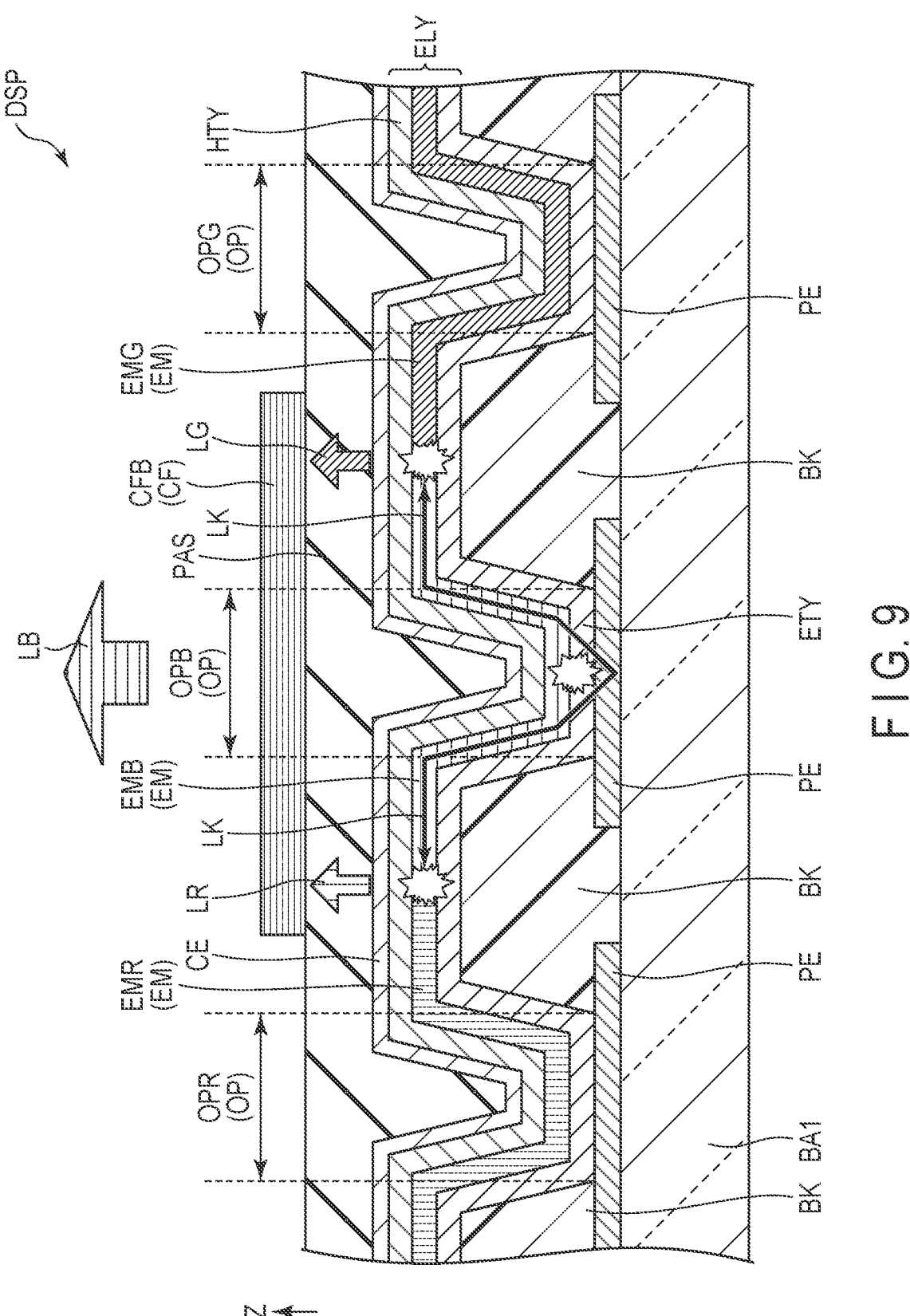
FIG. 9 is a cross-sectional view showing a configuration example of the display device of the comparative example.

FIG. 9 is a cross-sectional view of another configuration example of the display device in the embodiment. The configuration example shown in FIG. 9 is different from that of FIG. 6 in that only the color filters CFB is provided, and the color filters CFR and the color filters CFG are not provided.

In the display device DSP shown in FIG. 9, advantageous effects similar to those of the display device shown in FIG. 6 can be obtained.

FIG. 10 is a plan view of another configuration example of the display device in the embodiment. The configuration example shown in FIG. 10 is different from that of FIG. 8 in that the pixel arrangement is a stripe array.

In the display device DSP shown in FIG. 10, a set of a pixel PXR, pixel PXG and pixel PXB is repeatedly disposed in this order along the first direction X. The plurality of pixels PXR are disposed adjacent to each other along the second direction Y. The plurality of pixels PXG are disposed adjacent to each other along the second direction Y. The plurality of pixels PXB are disposed adjacent to each other along the second direction Y.

The color filter CFR of the pixel PXR and the color filter CFG of the pixel PXG may have the same size. The length of the color filter CFB of the pixel PXB along the second direction Y may be the same as that of the color filter CFR and the color filter CFG. The length of the color filter CFB along the first direction X is greater than that of the color filter CFR and the color filter CFG. In other words, the color filter CFB is greater in size than the other color filters CFR and CFG.

In FIG. 10 as well, the end portion DBY of the color filters CFB cover the boundary between the emitting layer EMR and the emitting layer EMB and the boundary between the emitting layer EMG and the emitting layer EMB. With this configuration, even if light emission occurs in a pixel to which voltage is not applied, the light emission can be shielded by the color filter CFB. Thus, a display device with high display quality can be obtained.

Figure 11:
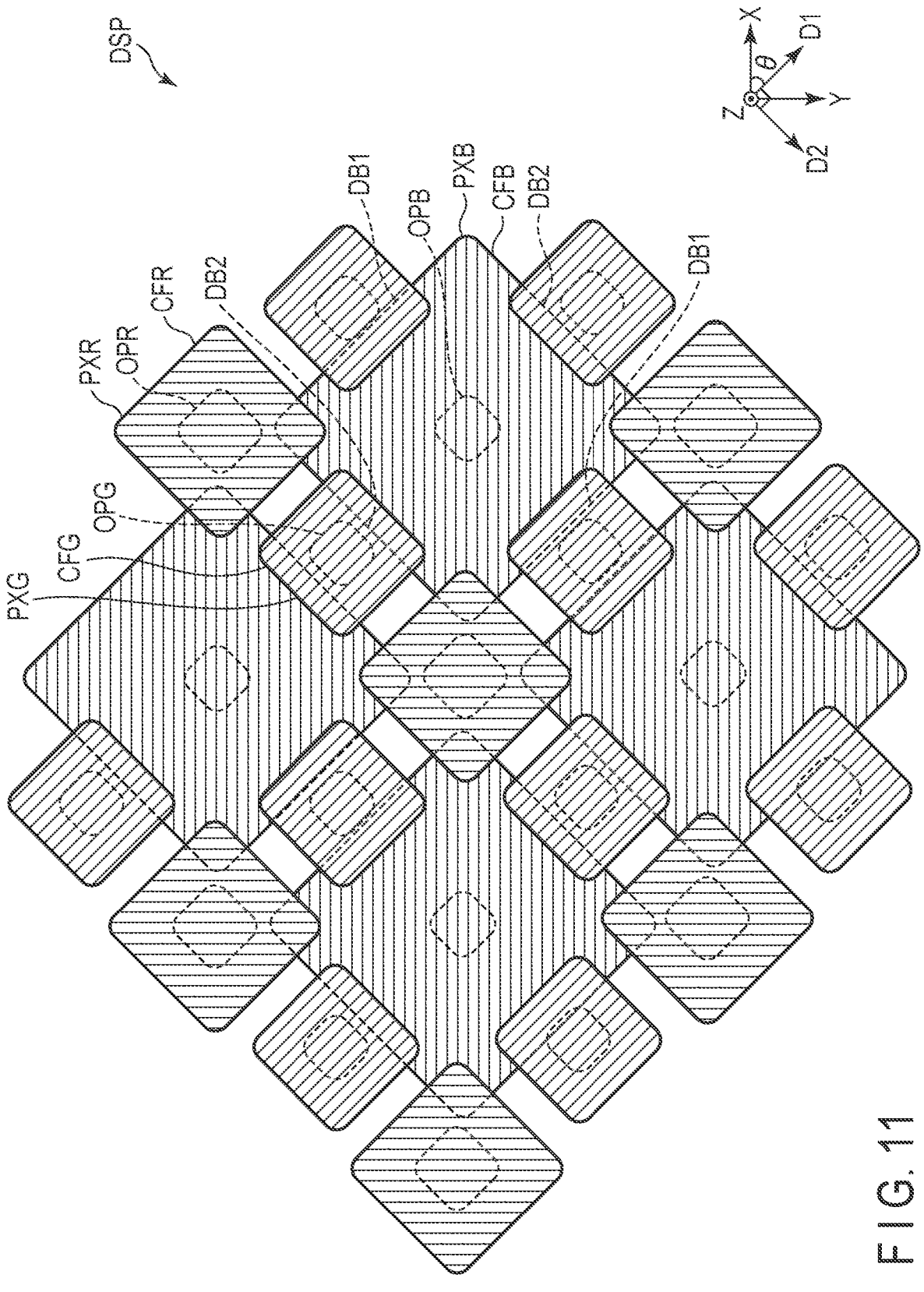
FIG. 11 is a plan view schematically showing a configuration example of the display device of the embodiment.

FIG. 11 is a plan view of still another configuration example of the display device in the embodiment. The configuration example shown in FIG. 11 is different from that of FIG. 8 in that the pixel arrangement is a so-called pen-tile array.

In the display device DSP shown in FIG. 11, a direction that makes an angle θ clockwise with respect to the first direction X is defined as a direction D1. The angle θ is, for example, 45°. A direction that makes 90° with respect to the direction D1 is defined as a direction D2.

Each pixel PXR is disposed adjacent to other pixels PXB along the first direction X. Each pixel PXR is disposed adjacent to the respective pixel PXB along the second direction Y. Each pixel PXR is disposed adjacent to the respective pixel PXG along the direction D1. The pixel PXR is disposed adjacent to the respective pixel PXG along the direction D2.

Each pixel PXG is disposed adjacent to another pixel PXG along direction X1. Each pixel PXG is disposed adjacent to another pixel PXG along the second direction Y. Each pixel PXG is disposed adjacent to the respective pixel PXR or to the respective pixel PXB along the direction D1. The pixel PXG is disposed adjacent to the respective pixel PXR or to the respective pixel PXB along the direction D2.

Each pixel PXB is disposed adjacent to the respective pixel PXR along direction X1. Each pixel PXB is disposed adjacent to the respective pixel PXR along the second direction Y. Each Pixel PXB is disposed adjacent to the respective pixel PXG along the direction D1. Each pixel PXB is disposed adjacent to the respective pixel PXG along the direction D2.

The size of the pixel PXR is greater than the size of the pixel PXG and smaller than the size of the pixel PXB. The size of the pixel PXG is smaller than the size of each of the pixel PXR and the pixel PXB. The size of the pixel PXB is larger than the size of each of the pixel PXR and the pixel PXG.

The size of the color filter CFR of the pixel PXR is larger than the size of the color filter CFG of the pixel PXG and smaller than the size of the color filter CFB of the pixel PXB. The size of the color filter CFG of the pixel PXG is smaller than the size of each of the color filter CFR and the color filter CFB. The size of the color filter CFB of the pixel PXB is larger than the size of each of the color filter CFR and the color filter CFG.

In the color filter CFB, an end portion along the direction D1 is referred to as an end portion DB1. In the color filter CFB, an end portion along the direction D2 is referred to as an end portion DB2. Both the end portion DB1 and the end portion DB2 overlap the color filter CFR and the color filter CFG. In FIG. 11, both the end portion DB1 and the end portion DB2 of the color filter CFB cover the boundary between the emitting layer EMR and the emitting layer EMB and the boundary between the emitting layer EMG and the emitting layer EMB.

In the display device DSP shown in FIG. 11 as well, even if light emission occurs in a pixel to which voltage is not applied, the light emission can be shielded by the color filters CFB. Thus, a display device with high display quality can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a plurality of first pixels, a plurality of second pixels and a plurality of third pixels;
a first emitting layer provided in each of the plurality of first pixels, which emits a first color;
a second emitting layer provided in each of the plurality of second pixels, which emits a second color,
a third emitting layer provided in each of the third plurality of third pixels, which emits a third color;
a first color filter opposing the first emitting layer;
a second color filter opposing the second emitting layer; and
a third color filter provided to oppose the third emitting layer, wherein
a threshold voltage of the third emitting layer is higher than a threshold voltage of the first emitting layer and a threshold voltage of the second emitting layer,
the third color filter overlaps a boundary between each first emitting layer and a respective third emitting layer and a boundary between a second emitting layer and a respective third emitting layer, so that the third color filter overlaps the first emitting layer and the second emitting layer,
the third color filter overlaps the first color filter and the second color filter, the third color filter is larger than each of the first color filter and the second color filter,
the first color filter includes a first region which overlaps the third emitting layer,
the second color filter includes a second region which overlaps the third emitting layer,
the third color filter includes a third region which overlaps each of the first emitting layer and the second emitting layer, and
the third region is larger than each of first region and the second region.

2. The display device according to claim 1, wherein the first color, the second color and the third color are red, green and blue, respectively.

3. The display device according to claim 1, wherein the first emitting layer, the second emitting layer and the third emitting layer each comprises an organic electroluminescent emitting material.

4. The display device according to claim 1, wherein the first pixels, the second pixels and the third pixels each comprises,
a pixel electrode,
an electron transport layer,
one of the first emitting layer, the second emitting layer and the third emitting layer corresponding to the first pixels, the second pixels and the third pixels, respectively,
a hole transport layer, and
a common electrode.

5. The display device according to claim 1, wherein the plurality of first pixels, the plurality of second pixels and the plurality of third pixels are arranged in a square-stripe array.

6. The display device according to claim 1, wherein the plurality of first pixels, the plurality of second pixels and the plurality of third pixels are arranged in a stripe array.

7. The display device according to claim 1, wherein the plurality of first pixels, the plurality of second pixels and the plurality of third pixels are arranged in a pen-tile array.

8. A display device comprising:
a plurality of first pixels, a plurality of second pixels and a plurality of third pixels;
a first emitting layer provided in each of the plurality of first pixels, which emits a red color;
a second emitting layer provided in each of the plurality of second pixels, which emits a green color;
a third emitting layer provided in each of the third plurality of third pixels, which emits a blue color;
a red color filter opposing the first emitting layer;
a green color filter opposing the second emitting layer; and
a blue color filter provided to oppose the third emitting layer, wherein
the blue color filter overlaps a boundary between each first emitting layer and a respective third emitting layer and a boundary between a second emitting layer and a respective third emitting layer, so that the blue color filter overlaps the first emitting layer and the second emitting layer,
the blue color filter overlaps the red color filter and the green color filter,
the blue color filter is larger than each of the red color filter and the green color filter,
the red color filter includes a first region which overlaps the third emitting layer, the green color filter includes a second region which overlaps the third emitting layer, the blue color filter includes a third region which overlaps each of the first emitting layer and the second emitting layer, and the third region is larger than each of first region and the second region.

9. The display device according to claim 8, wherein a threshold voltage of the third emitting layer is higher than a threshold voltage of the first emitting layer and a threshold voltage of the second emitting layer.

10. The display device according to claim 8, wherein the first emitting layer, the second emitting layer and the third emitting layer each comprises an organic electroluminescent emitting material.

11. The display device according to claim 8, wherein the first pixels, the second pixels and the third pixels each comprises, a pixel electrode, an electron transport layer, one of the first emitting layer, the second emitting layer and the third emitting layer corresponding to the first pixels, the second pixels and the third pixels, respectively, a hole transport layer, and a common electrode.

12. The display device according to claim 8, wherein the plurality of first pixels, the plurality of second pixels and the plurality of third pixels are arranged in a square-stripe array.

13. The display device according to claim 8, wherein the plurality of first pixels, the plurality of second pixels and the plurality of third pixels are arranged in a stripe array.

14. The display device according to claim 8, wherein the plurality of first pixels, the plurality of second pixels and the plurality of third pixels are arranged in a pen-tile array.

* * * * *